(12) United States Patent
Numasawa et al.

(10) Patent No.: US 7,589,002 B2
(45) Date of Patent: Sep. 15, 2009

(54) METHOD OF FORMING AN OXYGEN- OR NITROGEN-TERMINATED SILICON NANOCRYSTALLINE STRUCTURE AND AN OXYGEN- OR NITROGEN-TERMINATED SILICON NANOCRYSTALLINE STRUCTURE FORMED BY THE METHOD

(75) Inventors: Yoichiro Numasawa, Tokyo (JP); Yukinobu Murao, Tokyo (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 12/152,944

(22) Filed: May 19, 2008

(65) Prior Publication Data

US 2008/0230781 A1 Sep. 25, 2008

Related U.S. Application Data

(63) Continuation of application No. 11/826,476, filed on Jul. 16, 2007, now abandoned, which is a continuation of application No. 10/645,908, filed on Aug. 22, 2003, now abandoned.

(30) Foreign Application Priority Data

Aug. 23, 2002 (JP) ............................ 2002-243342

(51) Int. Cl.
*H01L 21/36* (2006.01)
*H01L 21/20* (2006.01)

(52) U.S. Cl. ................. 438/488; 257/E21.09; 438/489; 977/814

(58) Field of Classification Search ................. 438/488, 438/489; 257/E21.09; 977/814
See application file for complete search history.

(56) References Cited

U.S. PATENT DOCUMENTS

| 6,090,666 A | 7/2000 | Ueda et al. |
| 6,887,725 B2 | 5/2005 | Oda et al. |

FOREIGN PATENT DOCUMENTS

| JP | 2000-277501 | 10/2000 |
| JP | 2001-332168 | 11/2001 |
| JP | 2002-64066 | 2/2002 |
| JP | 2002-100578 | 4/2002 |

OTHER PUBLICATIONS

English translation of Official Letter dated Jan. 6, 2009 issued in connection with Japanese Patent Application No. 2002-243342 corresponding to the present U.S. application.

*Primary Examiner*—Asok K Sarkar
(74) *Attorney, Agent, or Firm*—Wenderoth, Lind & Ponack, L.L.P.

(57) ABSTRACT

An oxygen- or nitrogen-terminated silicon nanocrystalline structure is formed on a silicon substrate by forming a silicon film of fine silicon crystals and amorphous silicon on a substrate, and oxidizing or nitriding the formed silicon film with ions and radicals formed from an oxidizing gas or a nitriding gas. The oxidizing or nitriding step comprises substeps of disposing the substrate provided with the silicon film in an oxidizing or nitriding gas atmosphere within a plasma treatment chamber, and then plasma-oxiziding or plasma-nitriding the substrate provided with the silicon film by applying a high frequency electric field to the oxidizing or nitriding gas atmosphere. The method allows the particle diameter of the oxygen- or nitrogen-terminated silicon nanocrystals to be regulated to an accuracy of 1 to 2 nm, the density thereof per unit area to be increased, and the silicon nanocrystalline structure to be produced easily and inexpensively.

7 Claims, 5 Drawing Sheets

◎ : Si (Silicon)
○ : H (Hydrogen)
★ : O (Oxygen)

◎ : Si (Silicon)
○ : H (Hydrogen)
★ : O (Oxygen) or N (Nitrogen)

11: Reaction Container
12: substrate
13: Upper Electrode
14: Lower Electrode
58: Insulator Ring

FIG. 5 (prior art)

Pretreatment of Substrate

↓

Growth of Polysilicon Film
(up to 1 μm in thickness)
in CVD Equipment

↓

Anodizing Treatment in a Chemical Synthesis Unit

METHOD OF FORMING AN OXYGEN- OR NITROGEN-TERMINATED SILICON NANOCRYSTALLINE STRUCTURE AND AN OXYGEN- OR NITROGEN-TERMINATED SILICON NANOCRYSTALLINE STRUCTURE FORMED BY THE METHOD

This application is a continuation application of Ser. No. 11/826,476, filed Jul. 16, 2007, now abandoned which is a continuation application of Ser. No. 10/645,908, filed Aug. 22, 2003 now abandoned.

BACKGROUND OF THE INVENTION

1. Field of the Invention

The present invention relates to a method of forming an oxygen- or nitrogen-terminated silicon nanocrystalline structure (porous silicon) and in particular to a novel method of forming a silicon nanocrystalline structure (porous silicon) by using a plasma treatment equipment and to a silicon nanocrystalline structure (porous silicon) formed by the method.

2. Description of the Related Art

Semiconductors of compounds such as gallium and arsenic would be applicable as silicon-based light-emitting elements used in the fields of optical interconnection for optical communication, optical communication and visible-light sources.

However, semiconductors of compounds such as gallium and arsenic hardly produce a structure with fewer defects on a silicon substrate, and are poor in thermostability. Because the existing process of producing silicon integrated circuits cannot deal with such production, a new production process is necessary, thus increasing production costs.

Accordingly, there is demand for techniques of producing silicon-based light-emitting structures that can be produced by only the existing process of producing silicon integrated circuits.

As a silicon-based light-emitting material, a silicon nanocrystalline structure (porous silicon) produced by anodizing is known.

A flow of anodizing treatment, i.e. a conventional process for producing a silicon nanocrystalline structure (porous silicon), is shown in FIG. 5.

In FIG. 5, a polysilicon film is formed to a thickness of about 1 μm on a substrate by CVD (Chemical Vapor Deposition) method, and then the polysilicon film formed by CVD method is subjected to anodizing treatment.

For example, when an electrolytic cell filled with an electrolyte such as an aqueous solution of HF, wherein a semiconductor such as silicon substrate is used as an anode and platinum is used as a cathode, is electrified, electrons are transferred from the anode through an external circuit to the cathode, and oxidation reaction in a general meaning proceeds on the surface of the anode (i.e. the silicone substrate) contacting with the electrolyte.

However, a silicon nanocrystalline structure (porous silicon) produced by the above-mentioned conventional method has problems such as low luminous efficiency and a low luminous extinction rate in the order of microsecond (μsec). Further, the production process is complicated because of its wet process involving an electrochemical treatment, and is hardly applied to a process of producing silicon integrated circuits. There is also a problem that the surface of silicon nanocrystalline structure (porous silicon) thus produced is covered with hydrogen atoms, and it is unstable in composition, and fragile, so that it is easily broken.

Japanese Patent Application Laid-Open (JP-A) No. 2000-273450 proposes a silicon nanocrystalline structure (porous silicon) that can be produced directly on a substrate such as a silicon substrate by the process of producing silicon integrated circuits. In this prior art, a silicon-based light-emitting material having a silicon-rich amorphous structure, based on silicon and nitrogen, is produced from a raw material gas such as silane ($SiH_4$) and an ammonia gas ($NH_3$) in a specific ratio of raw material gas/(raw material gas+ammonia gas) by CVD method at specific temperature.

The conventional method of forming a silicon nanocrystalline structure (porous silicon), shown in the treatment flow in FIG. 5, involves formation, by chemical synthesis, of a nanocrystalline structure of a polysilicon film of 1 μm in thickness produced by CVD and simultaneous oxygen termination of the surface of the said polysilicon film. That is, the formation of a nanocrystalline structure by a polysilicon oxidation/etching process and the oxygen termination of the surface by an oxidization process proceed simultaneously in the chemical treatment. Due to this production process, the particle diameter of the oxygen-terminated silicon nanocrystalline structure is hardly regulated in an accuracy of 1 to 2 nm, thus causing problems such as varying luminescent colors.

The before described JP-A No. 2000-273450 does not refer to the regulation of the particle diameter of the silicon nanocrystalline structure (porous silicon) affecting luminescent colors.

Further, because nanocrystals formed during the chemical treatment may disappear in the subsequent etching/oxidization process, there is the problem of a reduction in density of nanocrystals per unit area. This problem is a major cause of a reduction in luminous efficiency in a porous silicon luminescent system using the silicon nanocrystalline structure (porous silicon) formed by the conventional method shown in the treatment flow in FIG. 5.

SUMMARY OF THE INVENTION

Accordingly, the object of the present invention is to provide a silicon nanocrystalline structure (porous silicon) which can be produced easily and inexpensively by proposing a novel method of forming a silicon nanocrystalline structure (porous silicon). According to the said novel method proposed by the present invention, a silicon nanocrystalline structure (porous silicon) can be formed on a substrate such as a silicon substrate by using a process of producing silicon integrated circuits. And, according to the said novel method, it can achieve high luminous efficiency, and the surface of formed silicon nanocrystalline structure is terminated reliably with oxygen or nitrogen to stabilize its composition. Also, the particle diameter of the oxygen- or nitrogen-terminated silicon nanocrystalline structure (porous silicon) can be regulated in an accuracy of 1 to 2 nm, and the density thereof per unit area can be increased by the said novel method.

To accomplish the before described object, one aspect of the present invention provides a method of forming an oxygen- or nitrogen-terminated silicon nanocrystalline structure, which comprises a step of forming a silicon film of nanometer scale thickness composed of fine silicon crystals and amorphous silicon on a substrate and a step of oxidizing or nitriding the formed silicon film with ions and radicals formed from an oxidizing gas or a nitriding gas.

Another aspect of the present invention provides a method of forming an oxygen- or nitrogen-terminated silicon nanocrystalline structure, wherein a step comprising of the first step of forming a silicon film of nanometer scale thickness composed of fine silicon crystals and amorphous silicon on a substrate and the sequential second step of oxidizing or nitriding the formed silicon film with ions and radicals formed from an oxidizing gas or a nitriding gas is conducted plural times.

According to the latter method, it is possible to form a multi-layer film containing an oxygen-terminated silicon nanocrystalline structure, a multi-layer film containing a nitrogen-terminated silicon nanocrystalline structure, or a structure wherein a multi-layer film containing an oxygen-terminated silicon nanocrystalline structure is laminated with a multi-layer film containing a nitrogen-terminated silicon nanocrystalline structure.

In the before described methods of the present invention, the step of forming a silicon film of nanometer scale thickness composed of fine silicon crystals and amorphous silicon on a substrate can make use of either of the following two methods.

A first method is a method wherein a silicon film of nanometer scale thickness composed of fine silicon crystals and amorphous silicon is formed on a substrate by using a thermal catalysis reaction in a gas system containing at least a silicon hydride gas and a hydrogen gas.

A second method is a method wherein a silicon film of nanometer scale thickness composed of fine silicon crystals and amorphous silicon is formed on a substrate by setting the substrate at a predetermined temperature in a plasma treatment chamber and then applying a high-frequency electric field while controlling the inside of the plasma treatment chamber at a reduced pressure and containing at least a silicon hydride gas and a hydrogen gas.

A schematic diagram of the silicon film of nanometer scale thickness composed of fine silicon crystals and amorphous silicon formed on a substrate by these steps is shown in FIG. 1(a).

When the latter method (second method) is used, a VHF-range high frequency having a higher frequency than 60 MHz can be adopted as the high frequency of the high-frequency electric field applied in the step of forming a silicon film of nanometer scale thickness composed of fine silicon crystals and amorphous silicon on a substrate. The VHF-range high frequency having a higher frequency than 60 MHz is advantageous for promoting dissociation of hydrogen and oxygen.

When the former method (first method) is used, a thermal catalysis reaction chamber can be used as a reaction chamber for forming a silicon film of nanometer scale thickness composed of fine silicon crystals and amorphous silicon on a substrate. As the thermal catalyst reaction chamber, a chamber proposed in e.g. JP-A No. 2000-277501 can be used. That is, a thermal catalyst reaction chamber for a chemical vapor deposition (CVD) equipment can be used. This thermal catalyst reaction chamber comprises a treatment container in which a predetermined treatment such as formation of a film on a substrate is conducted, a gas feeding system supplying a predetermined raw material gas to the said treatment container, a heater such as tungsten arranged in the said treatment container so as to allow the supplied raw material gas to pass through the surface of it, an energy supplying mechanism supplying energy to the heater so as to maintain the heater at a predetermined high temperature, and a substrate holder maintaining a substrate at that position in the treatment container at which a predetermined film is formed on the said substrate by decomposition or activation of the raw material gas on the surface of the heater maintained at a predetermined high temperature (for example, 1500 to 1900° C.). As the raw material gas, a gas containing at least silicon hydride gas and a hydrogen gas is used.

It is well-known to engineers participating in a technology for growth of amorphous silicon or polysilicon that a silicon film of nanometer scale thickness composed of fine silicon crystals and amorphous silicon can be formed on a substrate by using a thermal catalyst reaction in a gas system containing at least a silicon hydride gas and a hydrogen gas.

In either of the above methods of forming an oxygen- or nitrogen-terminated silicon nanocrystalline structure, the step of oxidizing or nitriding the silicon film formed on a substrate with ions and radicals formed from an oxidizing gas or a nitriding gas can be conducted by plasma oxidizing treatment or plasma nitriding treatment of the silicon film by arranging the substrate having the silicon film formed thereon in a plasma treatment chamber, replacing the atmosphere in the plasma treatment chamber by an oxidizing or nitriding gas atmosphere and then applying a high-frequency electric field.

In this case, the plasma oxidizing treatment or plasma nitriding treatment can be composed of plasma oxidizing treatment or plasma nitriding treatment in an oxidizing or nitriding gas atmosphere, subsequent etching treatment, with an HF-based gas, of the surface of fine silicon crystals in the silicon film formed on the substrate, or plasma etching treatment of the surface of fine silicon crystals in the silicon film formed on the substrate in a molecular gas system containing fluorine, and subsequent plasma oxidizing treatment or plasma nitriding treatment in an oxidizing or nitriding gas atmosphere. This method is advantageous because termination with oxygen or nitrogen can be completely achieved although the treatment time is longer.

In the plasma oxidizing treatment or plasma nitriding treatment, the oxidizing or nitriding rate of amorphous silicon regions in the silicon film of nanometer scale thickness composed of fine silicon crystals and amorphous silicon is significantly higher than in crystalline regions. This is because many Si—H linkages occur in the amorphous silicon regions. Accordingly, the silicon crystalline regions can be terminated throughout with oxygen or nitrogen as shown in FIG. 1(b).

Examples of the usable oxidizing gas include an oxygen gas, and examples of the usable nitriding gas include an ammonia gas and a nitrogen gas, etc.

Examples of the usable high-frequency, a high frequency having an LF-range high frequency applied to a VHF-range high frequency having a higher frequency than 60 MHz can be used as the high frequency of the high-frequency electric field applied in the plasma oxidizing treatment or plasma nitriding treatment.

Generally speaking, when plasma is formed by high-frequency electric power, the acceleration of charged particles constituting the plasma colliding against a substrate is decreased as the frequency of the high-frequency electric power is increased, and less damage is given to the substrate. For promoting the dissociation of hydrogen and oxygen and simultaneously increasing the acceleration of charged particles constituting the plasma colliding against a substrate, an LF-range high frequency is superposed as second high frequency on the high frequency (for example the above-mentioned VHF-range high frequency having a higher frequency than 60 MHz) from a high-frequency power source, to accelerate the nitriding or oxidizing gas to collide against the substrate, whereby nitrogen or oxygen termination of the surface and the inside of the silicon film can be promoted.

Accordingly, a high frequency having an LF-range high frequency applied to a VHF-range high frequency higher than 60 MHz is applied for the plasma oxidizing or plasma nitriding treatment, whereby the silicon film of nanometer scale thickness composed of fine silicon crystals and amorphous silicon can be terminated more reliably with oxygen or nitrogen.

In the methods of forming an oxygen- or nitrogen-terminated silicon nanocrystalline structure as described above, the thickness of the silicon film is desirably between 1 and 10 nm in the step of forming the silicon film of nanometer scale thickness composed of fine silicon crystals and amorphous silicon on a substrate. This is because the thickness of the silicon film in this range is preferable for efficiently proceeding the subsequent oxidizing treatment (for example, plasma oxidizing treatment) or nitriding treatment (for example, plasma nitriding treatment) of the silicon film with ions and radicals formed from an oxidizing gas or a nitriding gas.

Accordingly, the thickness of the silicon film is preferably thicker by about 0.5 nm than the desired particle diameter of an oxygen- or nitrogen-terminated silicon nanocrystalline structure to be formed. For example, when an oxygen- or nitrogen-terminated silicon nanocrystalline structure having a particle diameter of 3 nm is to be formed, the thickness of the silicon film is desirably 3.5 nm.

When a cluster-type unit system provided with two chambers, that is, a chamber for forming a silicon film of nanometer scale thickness composed of fine silicon crystals and amorphous silicon on a substrate and a chamber for plasma oxidizing treatment in an oxidizing gas atmosphere or for plasma nitriding treatment in a nitriding gas atmosphere such as ammonia gas is used. And if the step of forming a silicon film of nanometer scale thickness composed of fine silicon crystals and amorphous silicon on a substrate is carried out by using a thermal catalysis reaction in a gas system containing at least a silicon hydride gas and a hydrogen gas, constituted such that the above-described thermal catalysis reaction chamber of the cluster-type unit system can be used as a chamber for forming a silicon film of nanometer scale thickness composed of fine silicon crystals and amorphous silicon on a substrate.

When the step of forming a silicon film of nanometer scale thickness composed of fine silicon crystals and amorphous silicon on a substrate is carried out by setting the substrate at a predetermined temperature in a plasma treatment chamber and then applying a high-frequency electric field while regulating the inside of the plasma treatment chamber at a reduced pressure containing at least a silicon hydride gas and a hydrogen gas, the step of forming a silicon film of nanometer scale thickness composed of fine silicon crystals and amorphous silicon on a substrate by using the plasma treatment chamber and the subsequent step of oxidizing or nitriding the formed silicon film with ions and radicals formed from an oxidizing gas or a nitriding gas can be carried out by using the same plasma treatment chamber.

This can be carried out as follows. A substrate is set at a predetermined temperature in the plasma treatment chamber, then the inside of the plasma treatment chamber is regulated at a reduced pressure containing at least a silicon hydride gas and a hydrogen gas. A high-frequency electric field is applied to form a silicon film of nanometer scale thickness composed of fine silicon crystals and amorphous silicon on the substrate. After application of the high-frequency electric field is terminated, replacing the atmosphere in the plasma treatment chamber by an oxidizing or nitriding gas atmosphere. And a high-frequency electric field is applied again for plasma oxidizing treatment or plasma nitriding treatment of the silicon film formed on the substrate.

The thermal catalyst reaction chamber is advantageously used as a chamber for forming a silicon film of nanometer scale thickness composed of fine silicon crystals and amorphous silicon on a substrate because the thermal catalyst reaction chamber is more inexpensive than the plasma treatment chamber, to reduce production costs.

The silicon nanocrystalline structure proposed by the present invention, that is, the porous silicon, is formed by any one of the above methods of forming an oxygen- or nitrogen-terminated silicon nanocrystalline structure according to the present invention, and can be used widely as a silicon nano-luminous element.

That is, when a silicon nanocrystalline structure (porous silicon) is utilized as a luminous element, the visible emission range is a problem. But, in the present invention, a silicon film of nanometer scale thickness in the range of several nm to several tens nm composed of fine silicon crystals and amorphous silicon can be formed on a substrate to regulate the particle diameter of fine silicon crystals in the film. So that, the silicon nanocrystalline structure (porous silicon) applicable to luminous elements can be provided by the present invention.

According to the method of forming a silicon nanocrystalline structure in the present invention, a silicon nanocrystalline structure can be formed on a substrate such as a silicon substrate by using a process of producing silicon integrated circuits. Also, according to the method of the present invention, it can achieve high luminous efficiency, and the surface of formed silicon nanocrystalline structure can be terminated reliably with oxygen or nitrogen. And, according to the method of the present invention, the particle diameter of the oxygen- or nitrogen-terminated silicon nanocrystals can be regulated in an accuracy of 1 to 2 nm, and the density thereof per unit area can be increased. Further, the silicon nanocrystalline structure can be produced easily and inexpensively.

Thus, the regulation of nanometer scale thickness in formation of an oxygen-terminated silicon nanocrystalline structure is significantly improved as compared with that in the prior art, and thus the performance of elements using the oxygen- or nitrogen-terminated silicon nanocrystalline structure formed by the method of the present invention can be significantly improved.

Further, the process from the step of forming a silicon film of nanometer scale thickness composed of fine silicon crystals and amorphous silicon on a substrate to the step of oxygen or nitrogen termination treatment can be carried out in one unit system. As a result, the unit cost can be reduced.

According to the method of forming a silicon nanocrystalline structure in the present invention, a nitrogen-terminated silicon nanocrystalline structure can also be easily formed, and thus new application of the silicon nanocrystalline structure can be achieved.

BRIEF DESCRIPTION OF THE DRAWINGS

FIG. 1(a) is a diagram showing a process of forming a silicon film of nanometer scale thickness composed of fine silicon crystals and amorphous silicon on a substrate, and FIG. 1(b) is a drawing showing the state of an oxygen- or nitrogen-terminated silicon nanocrystalline structure formed by selectively oxidizing or nitriding amorphous silicon regions;

FIG. 5 shows a flow of a conventional process of forming an oxygen-terminated silicon nanocrystalline structure (porous silicon).

DETAILED DESCRIPTION OF THE INVENTION

Hereinafter, embodiments of the present invention and preferable examples are described by reference to the accompanying drawings.

The plasma technology for regulating the nanometer scale thickness as described in the present invention depends significantly on the structure of the treatment equipment. Accordingly, one example of the plasma treatment equipment that can be used in the method of forming an oxygen- or nitrogen-terminated silicon nanocrystalline structure according to the present invention is described in more detail.

Figure 1A:
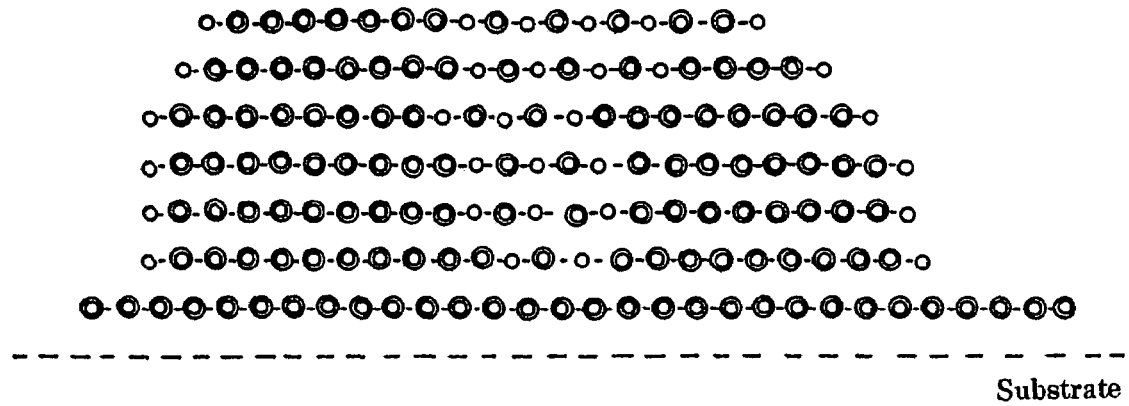
FIGS. 1(a) and 1(b) show a diagram of a process of forming a silicon nanocrystalline structure by the method of the present invention.
Figure 1B:
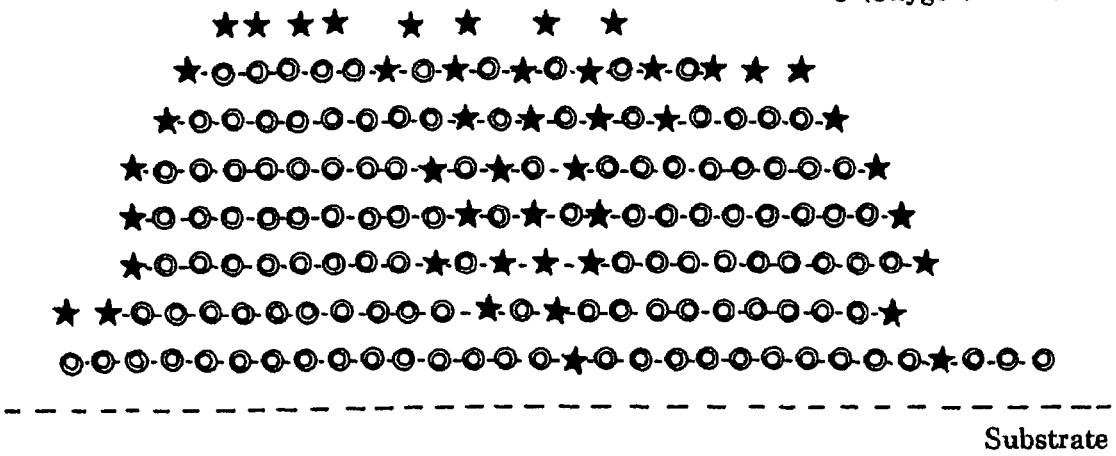
Figure 2:
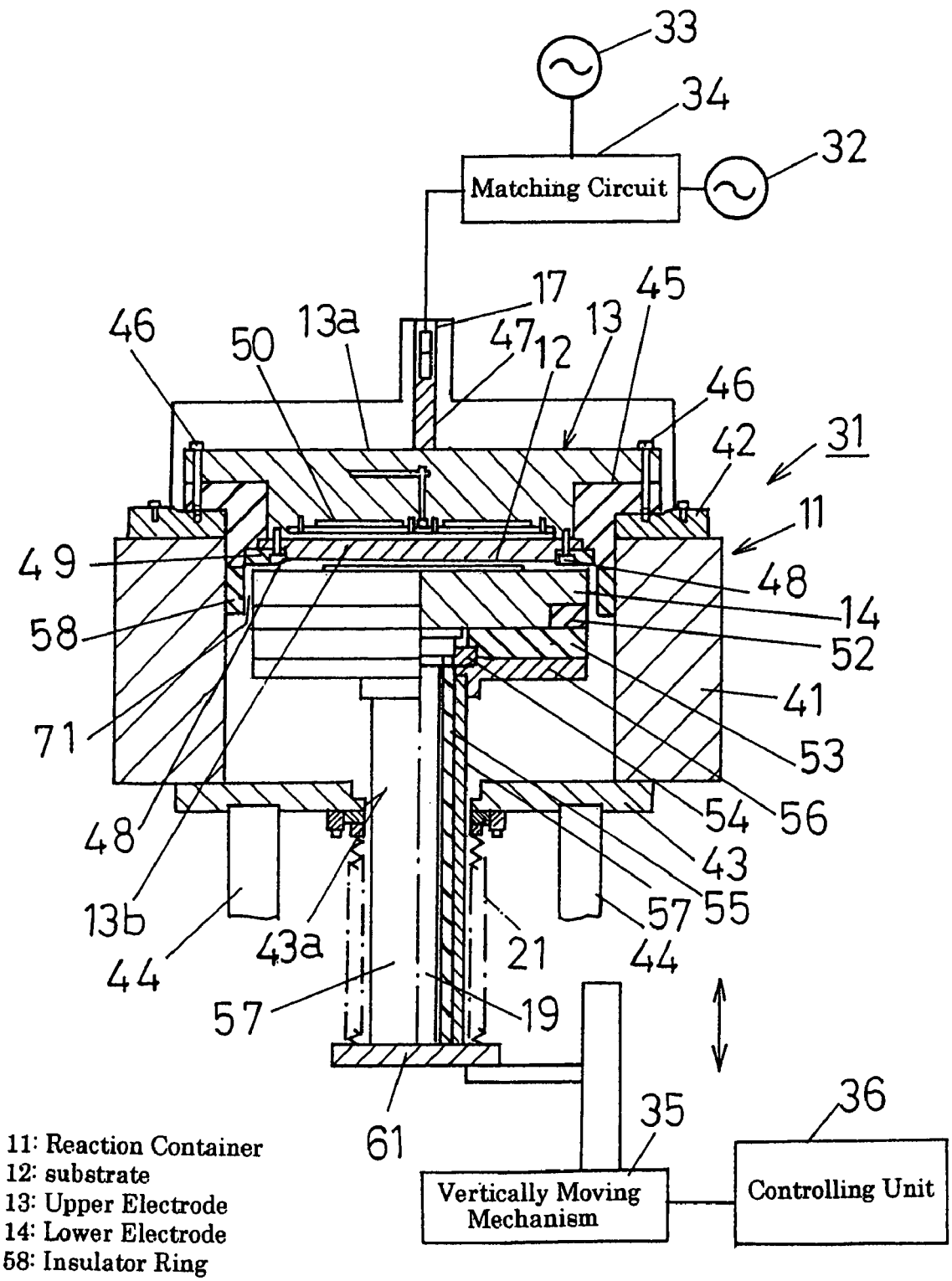
FIG. 2 is a longitudinal section of a partially omitted internal structure of a plasma treatment equipment used in the method of the present invention.
Figure 3:
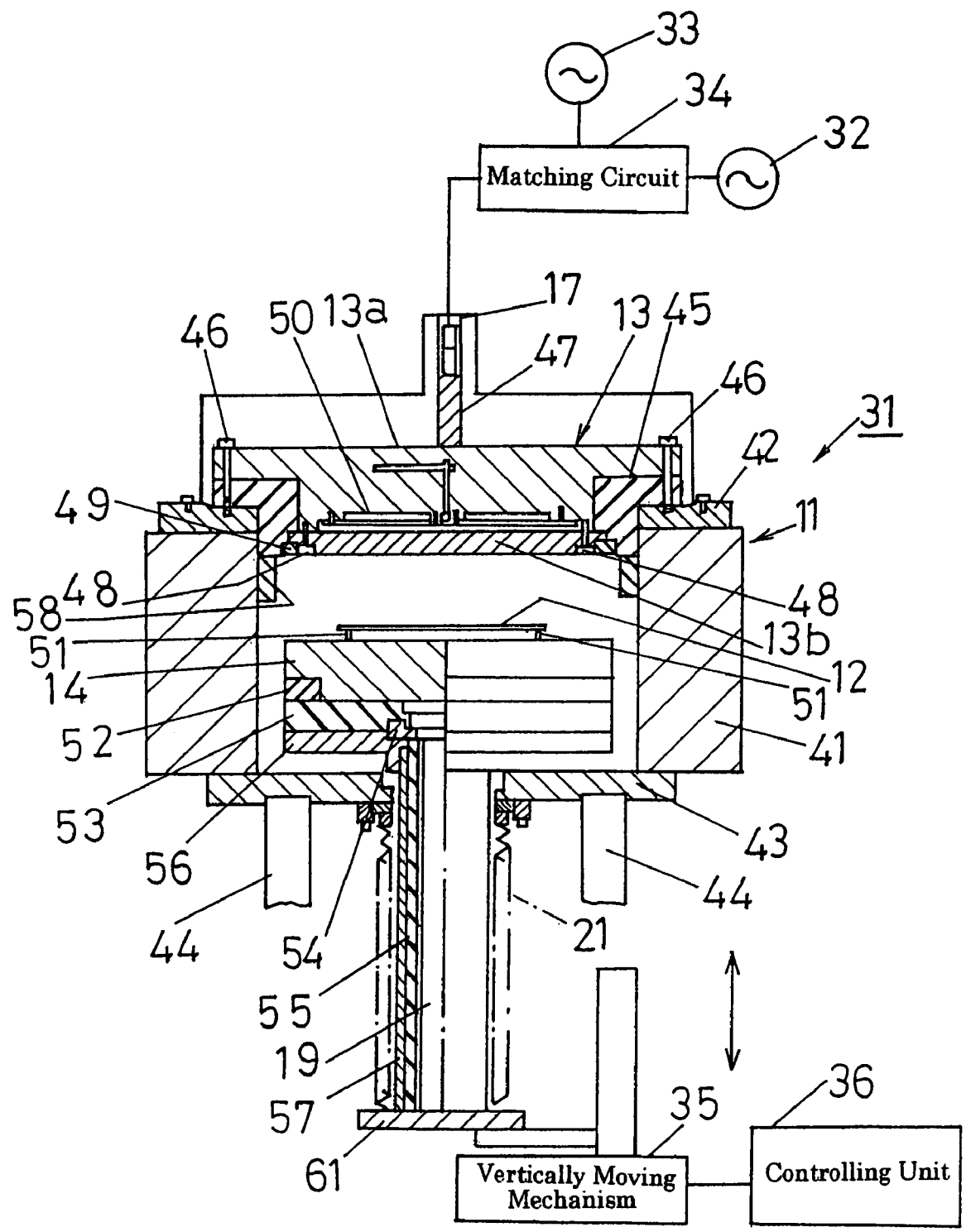
FIG. 3 is a longitudinal section of a partially omitted internal structure in another state of the plasma treatment equipment shown in FIG. 2.

FIGS. 2 and 3 show respectively a sectional view showing an internal structure of a plasma treatment equipment that can be used in the method of forming an oxygen- or nitrogen-terminated silicon nanocrystalline structure according to the present invention.

A plasma treatment unit 31 has a parallel plate-type electrode structure composed of an upper electrode 13 and a lower electrode 14.

The upper electrode 13 is an electrode to which two types of superposed high frequencies are fed via a matching circuit 34 from a high-frequency power source 32 for VHF-range high frequency and an LF-range high-frequency power source 33 for LF-range high frequency.

The lower electrode 14 is an earth electrode forming a substrate holder stage serving as a substrate-loading part.

The lower electrode 14 is provided with a vertically moving mechanism 35, and by the vertically moving mechanism 35, the lower electrode 14 is vertically transferred. In FIG. 2, the lower electrode 14 is in the highest position, and in FIG. 3, the lower electrode 14 is in the lowest position.

In the illustrated example, a reaction chamber 11 for plasma treatment is made of a closed structure, and the inside thereof is set in a predetermined vacuum (reduced pressure).

The reaction chamber 11 is made of a metallic material, and has electrical conductivity. The reaction chamber 11 is provided with a port for introducing or discharging a substrate 12 as the object of treatment, an exhaust port and evacuation system for achieving a predetermined vacuum therein, a gas-introducing mechanism for introducing a discharging gas causing discharge, etc., but these elements are those of known structures for the plasma treatment equipment and not important for describing the method of the present invention, and for the convenience of the description, these elements are not shown in FIGS. 2 and 3.

The reaction chamber 11 is composed of a cylindrical side member 41, a ceiling member 42 and a bottom member 43. The reaction chamber 11 is grounded and maintained at ground potential. The bottom member 43 is supported by a plurality of supporting columns 44 supporting the whole of the reaction chamber 11. The center of the ceiling member 42 is formed with an opening, and this opening is provided via a ring-shaped insulator 45 with the upper electrode 13 by a bolt 46. The upper electrode 13 is composed of an upper member 13a and a lower member 13b. A high frequency transmission cable 17 is connected to a connecting terminal 47 arranged on the center of the top of the upper member 13a. The lower member 13b is fixed by a screw 48 to the bottom of the upper member 13a. By the screw 48, the ring-shaped insulator 49 is also attached to the periphery of the bottom of the lower member 13b in the upper electrode 13. A gas passage 50 is formed in a space between the upper member 13a and the lower member 13b, and inside of the upper member 13a. A process gas can flow through the said gas passage 50. The gas introducing mechanism for introducing a discharging gas into the gas passage 50 is not shown in the drawing.

The upper electrode 13 and the lower electrode 14 are basically in the form of an electrically conductive plate that is circular as a whole, and are arranged parallel and facing with each another with a desired distance. The distance between the upper electrode 13 and the lower electrode 14 can be arbitrarily changed by changing the position of the lower electrode 14 by the vertically moving mechanism 35.

The upper electrode 13 is connected via the matching circuit 34 with the high-frequency power source 32 and the LF-range high-frequency power source 33. The high-frequency power source 32 is a power source for generating high frequency in the VHF range, while the LF-range high-frequency power source 33 is a power source for generating LF high frequency in the LF range. The high-frequency generated from the high-frequency power source 32 is preferably 60 MHz, while the high frequency from the LF-range high-frequency power source 33 is preferably 400 KHz. The high frequencies generated from the power sources 32 and 33 are superposed in the matching circuit 34, and then supplied in this state to the upper electrode 13. The high frequency and LF-range high frequency from the power sources 32 and 33 are supplied to the upper electrode 13 via the cable 17 and the connecting terminal 47. The high frequency supplied to the upper electrode 13 becomes the energy of major discharge generated in the gap between the upper electrode 13 and the lower electrode 14.

The high-frequency power source 32 supplies electric power for exciting plasma discharge. The LF-range high-frequency power source 33 gives self-bias voltage determining the collision energy of positive ions.

When the lower electrode 14 is in the highest position as shown in FIG. 2, the lower electrode 14 is elevated and transferred upwards, and thus the substrate 12 is loaded on the top of the lower electrode 14 in contact therewith.

A ring-shaped first insulator 52, a donut disk-shaped second insulator 53, a ring-shaped third insulator 54 and a cylindrical fourth insulator 55 are arranged on the backside of the lower electrode 14. The back of the lower electrode 14 and the whole surface of support 19 are covered with the first to fourth insulators 52 to 55. Further, the surfaces of the second to fourth insulators 53 to 55 are covered with two electroconductive members 56 and 57. The whole surfaces of the insulators 52 to 55 exposed in the reaction chamber 11, excluding the peripheries of the first and second insulators 52 and 53, are covered with the electroconductive members 56 and 57. The support 19 for the lower electrode 14 is rod-shaped and composed of an electroconductive member. The lower end of the support 19 is provided with an electroconductive flange 61. The support 19 for the lower electrode 14 and its related portions are arranged so as to extend via an opening 43a formed in the center of the bottom member 43 to the bottom of the reaction chamber 11. These portions are enclosed with a bellows 21 attached to the bottom of the bottom member 43 so as to cover the outside of the opening 43a formed in the bottom member 43.

In the method of forming an oxygen- or nitrogen-terminated silicon nanocrystalline structure according to the present invention, and in case the step of forming a silicon film of nanometer scale thickness composed of fine silicon crystals and amorphous silicon on a substrate is carried out by setting the substrate at a predetermined temperature in a plasma treatment chamber and then applying a high-frequency electric field while regulating the inside of the plasma treatment chamber at a reduced pressure containing at least a silicon hydride gas and a hydrogen gas, plasma excited by high frequency, for example plasma excited by VHF-range high frequency higher than 60 MHz, can be stably formed by using the structure of the plasma treatment equipment described above.

EXAMPLES

Then, preferable examples of the present invention using the plasma treatment equipment described above are described. In these examples, an 8-inch silicon substrate is used. However, the plasma treatment equipment may be designed so as to treat a 1 m square substrate, and the method of the present invention can be applied to the such large substrate.

Example 1

As a first example, an example of formation of an oxygen-terminated silicon nanocrystalline structure is described.

First, the silicon substrate 12 was placed on the lower electrode 14 in the position shown in FIG. 3, and then the lower electrode 14 was elevated to the position shown in FIG. 2 until the distance between the upper electrode 13 and the lower electrode 14 was reduced for example to 3 cm.

Thereafter, the silicon substrate 12 was set at a predetermined temperature. For example, the temperature of the silicon substrate 12 was increased to the same temperature (for example, 350° C.) as that of the lower electrode 14 and stabilized at that temperature. In this case, stabilization was attained in a short time by introducing a hydrogen gas.

Subsequently, a monosilane ($SiH_4$) gas, 0.026 mg/sec. (2 sccm), was mixed with a hydrogen gas, 0.95 mg/sec. (500 sccm) and introduced as a silicon hydride gas into the reaction chamber 11. And then, applying 600 MHz high-frequency power of 500 W with regulating the pressure at 10 Pa to form a silicon film of nanometer scale thickness composed of fine silicon crystals and amorphous silicon on the substrate.

The thickness of the silicon film can be regulated by selecting the deposition time, and in this example, the film was deposited for 5 seconds to form a silicon film of 3.5 nm in thickness.

Subsequently, the gas in the reaction chamber 11 was discharged, and a mixed gas of an oxygen gas (8.0 mg/sec. (500 sccm)) and an argon gas (3.4 mg/sec. (200 sccm)) was introduced as an oxidizing gas into the chamber 11. And then, superposing and applying 60 MHz high-frequency power of 500 W and 400 KHz high-frequency power of 200 W with regulating the pressure at 10 Pa were superposed for plasma oxidizing treatment.

The role of the argon gas is that it is ionized in plasma to selectively remove, by its ion impact, Si—H bonds constituting amorphous silicon regions in a silicon film of nanometer scale thickness composed of fine silicon crystals and amorphous silicon.

Under the conditions in this example, an oxygen-terminated silicon nanocrystalline structure could be formed by the plasma oxidizing treatment for 5 seconds.

Then, the before described silicon film-forming step and plasma oxidizing step were repeated 300 times for about 50 minutes in total. That is, the first silicon film-forming step followed by the first plasma oxidizing step was conducted, and then, the second silicon-forming step followed by the second plasma oxidizing step was conducted, so as to repeat the before described silicon film-forming step and plasma oxidizing step 300 times for about 50 minutes. Oxygen-terminated silicon nanocrystalline structure (porous silicon) about 1 μm was formed on the silicon substrate 12.

Example 2

Now, an example of formation of a nitrogen-terminated silicon nanocrystalline structure is described.

Similar to the first example, the silicon substrate 12 was placed on the lower electrode 14 in the position shown in FIG. 3, and then the lower electrode 14 was elevated to the position shown in FIG. 2 until the distance between the upper electrode 13 and the lower electrode 14 was reduced for example to 3 cm.

Thereafter, the silicon substrate 12 was set at a predetermined temperature. For example, the temperature of the silicon substrate 12 was increased to the same temperature (for example, 350° C.) as that of the lower electrode 14 and stabilized at that temperature. In this case, stabilization was attained in a short time by introducing a hydrogen gas.

Subsequently, a monosilane ($SiH_4$) gas, 0.026 mg/sec. (2 sccm), was mixed with a hydrogen gas, 0.95 ml/sec. (500 sccm) and introduced as a silicon hydride gas into the reaction chamber 11. And then, applying 60 MHz high-frequency power of 500 W with regulating the pressure at 10 Pa to form a silicon film of nanometer scale thickness composed of fine silicon crystals and amorphous silicon on the substrate. In the second example too, the film was deposited for 5 seconds to form a silicon film of 3.5 nm in thickness.

Subsequently, the gas in the reaction chamber 11 was discharged, and a mixed gas of an ammonia gas (4.9 mg/sec. (500 sccm)) and an argon gas (3.4 mg/sec. (200 sccm)) was introduced as a nitriding gas into the chamber 11 And then, superposing and applying 60 MHz high-frequency power of 700 W and 400 KHz high-frequency power of 200 W with regulating the pressure at 10 Pa for plasma nitriding treatment.

The reason for use of higher 60 MHz high-frequency power in this example than in the plasma oxidizing treatment in the first example is that the reaction energy is higher in the nitriding process.

In the nitriding treatment in the second example, a nitrogen-terminated silicon nanocrystalline structure could be formed by the plasma treatment for 5 seconds.

Then, as similar to the first example, the before described silicon film-forming step and plasma nitriding step were repeated 300 times for about 5.0 minutes in total. Nitrogen-terminated silicon nanocrystalline structure (porous silicon) about 1 μm was formed on the silicon substrate 12.

Example 3

In this example, after the step of forming a silicon film of nanometer scale thickness composed of fine silicon crystals and amorphous silicon on a substrate, the plasma oxidizing treatment or plasma nitriding treatment of the silicon film formed on the substrate was carried out by plasma oxidizing treatment or plasma nitriding treatment in an oxidizing or nitriding gas atmosphere. And then, etching treatment, with an HF-based gas, of the surface of fine silicon crystals in the silicon film formed on the substrate, or plasma etching treatment of the surface of fine silicon crystals in the silicon film formed on the substrate in a molecular gas system containing fluorine was carried out. And, subsequently, plasma oxidizing treatment or plasma nitriding treatment in an oxidizing or nitriding gas atmosphere was carried out. The process of this example is described below.

Similar to the first example, the silicon substrate 12 was placed on the lower electrode 14 in the position shown in FIG. 3, and then the lower electrode 14 was elevated to the position shown in FIG. 2 until the distance between the upper electrode 13 and the lower electrode 14 was reduced for example to 3 cm.

Thereafter, the silicon substrate 12 was set at a predetermined temperature. For example, the temperature of the silicon substrate 12 was increased to the same temperature (for example, 350° C.) as that of the lower electrode 14 and stabilized at that temperature. In this case, stabilization was attained in a short time by introducing a hydrogen gas.

Subsequently, a monosilane ($SiH_4$) gas, 0.026 mg/sec. (2 sccm), was mixed with a hydrogen gas, 0.95 mg/sec. (500 sccm) and introduced as a silicon hydride gas into the reaction chamber 11. And then, applying 600 MHz high-frequency power of 500 W with regulating the pressure at 10 Pa to form a silicon film of nanometer scale thickness composed of fine silicon crystals and amorphous silicon on the substrate. In the third example too, the film was deposited for 5 seconds to form a silicon film of 3.5 nm in thickness.

After the silicon film was formed, the gas in the reaction chamber 11 was discharged, and the plasma oxidizing treatment described in the first example was conducted.

Subsequently, the gas in the reaction chamber 11 was discharged, and a mixed gas of a carbon tetrafluoride ($CF_4$) gas (0.20 mg/sec. (5 sccm)) and an argon gas (1.7 mg/sec. (100 sccm)) was introduced as an etching gas into the chamber 11. And then, applying 6.0 MHz high-frequency power of 300 W with regulating the pressure at 50 Pa to conduct etching treatment for 3 seconds thereby removing an oxide layer on the surface.

Subsequently, the gas in the reaction chamber 11 was discharged, and the plasma oxidizing treatment described in the first example was conducted again.

Then, as similar to the first example, the before described silicon film-forming step and plasma oxidizing step were repeated 300 times for about 70 minutes in total. Oxygen-terminated silicon nanocrystalline structure about 1 μm was formed on the silicon substrate 12.

After formation of the silicon film and after the etching treatment, a nitrogen-terminated silicon nanocrystalline structure can be formed on the silicon substrate 12 by conducting the plasma nitriding treatment described in the second example in place of the plasma oxidizing treatment described in the first example. In this case, it is not an oxide layer but a nitride layer that is removed by the etching treatment.

Example 4

Two chambers, that is, a chamber for forming a silicon film of nanometer scale thickness composed of fine silicon crystals and amorphous silicon on a substrate and a chamber for plasma oxidizing treatment in an oxidizing gas atmosphere or for plasma nitriding treatment in a nitriding gas atmosphere were used to improve throughput capacity. An example of this process is described below.

In this case, the chamber for forming a silicon film of nanometer scale thickness composed of fine silicon crystals and amorphous silicon on a substrate is preferably a chamber for thermal catalysis reaction. This is because the thermal catalysis treatment chamber is more inexpensive than the plasma treatment chamber, thus reducing the cost of the unit.

Figure 4:
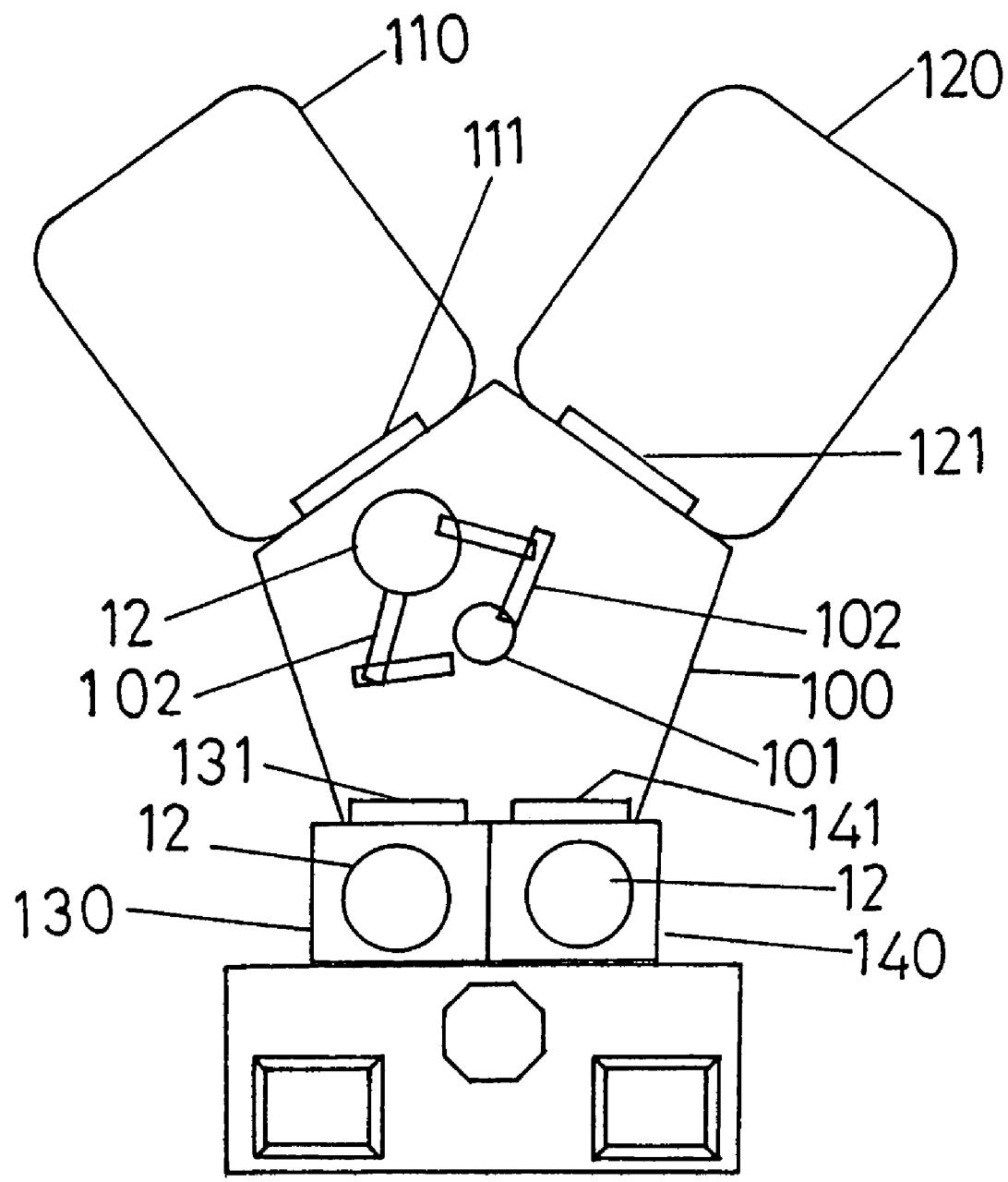
FIG. 4 is a schematic top plane view of a system structure having a thermal catalysis treatment chamber and a plasma treatment chamber integrated as a cluster-type unit system for carrying out the method of the present invention.

FIG. 4 shows a system structure having a thermal catalysis treatment chamber and a plasma treatment chamber integrated as a cluster-type unit system for this example.

As the plasma treatment chamber, the chamber shown in FIGS. 2 and 3 and used in Examples 1, 2 and 3 was used.

As the thermal catalyst reaction chamber, a thermal catalyst reaction chamber for a chemical vapor deposition equipment (CVD equipment) can be used. This thermal catalyst reaction chamber comprises a treatment container for predetermined treatment such as formation of a film on a substrate is conducted, a gas feeding system supplying a predetermined raw material gas to the said treatment container, a heater such as tungsten arranged in the said treatment container so as to allow the supplied raw material gas to pass through the surface of it, an energy supplying mechanism supplying energy to the heater so as to maintain the heater at a predetermined high temperature, and a substrate holder maintaining a substrate at that position in the treatment container at which a predetermined film is formed by decomposition or activation of the raw material gas on the surface of the heater maintained at a predetermined high temperature (for example, 1500 to 1900° C.). As proposed in JP-A No. 2000-277501 etc., such a chemical vapor deposition equipment (CVD equipment) is known in the art, and it is well-known to engineers participating in a technology for forming of amorphous silicon or polysilicon that a silicon film of nanometer scale thickness composed of fine silicon crystals and amorphous silicon can be formed on a substrate by a thermal catalyst reaction in a gas system containing at least a silicon hydride gas and a hydrogen gas, and thus a specific description thereof is omitted.

The following example shows the step of forming a silicon film of nanometer scale thickness composed of fine silicon crystals and amorphous silicon on a substrate and the step of plasma oxidizing treatment, and as a matter of course, it is possible to conduct nitrogen termination treatment or oxidation termination treatment and nitrogen termination treatment both involving etching treatment.

In FIG. 4, the silicon substrate 12 is placed in a delivery chamber 100.

First, the silicon substrate 12 was arranged in a substrate introduction chamber 130. A gate valve 131 for the substrate introduction chamber was opened, and by a robot 101, the silicon substrate 12 was transferred to the delivery chamber 100. The gate valve 131 for the substrate introduction chamber was closed, then a gate valve 111 for the thermal catalysis chamber was opened, the silicon substrate 12 was introduced into the thermal catalysis treatment chamber 110, and the gate valve 111 for the thermal catalysis chamber was closed.

When the temperature of the silicon substrate 12 in the thermal catalysis treatment chamber 110 reached a predetermined value, for example 300° C., a hydrogen gas (0.38 mg/sec. (200 sccm)) was sprayed onto the surface of a heater (tungsten) heated at 1800° C., to cause the catalysis reaction of hydrogen. The resulting hydrogen radicals were reacted with a monosilane ($SiH_4$) gas (0.026 mg/sec. (2 sccm)) introduced into the surface of the substrate, to form a silicon film of nanometer scale thickness which similar to the film in the first example, consisted of fine silicon crystals and amorphous silicon on the silicon substrate 12.

Subsequently, the gas in the thermal catalysis treatment chamber 110 was discharged, then the gate valve 111 for the thermal catalysis treatment chamber was opened, and the silicon substrate 12 was transferred to the delivery chamber 100. Subsequently, the gate valve 121 for the plasma treatment chamber was opened, the silicon substrate 12 was arranged in the plasma treatment chamber 120, and the gate valve 121 for the plasma treatment chamber was closed. After the gas in the plasma treatment chamber 120 was discharged, a mixed gas of an oxygen gas (8.0 mg/sec. (500 sccm)) and an argon gas (3.4 mg/sec. (200 sccm)) was introduced as an oxidizing gas into the plasma treatment chamber 120. And then, superposing and applying 60 MHz high-frequency power of 500 W and 400 KHz high-frequency power of 200 W the pressure 10 Pa for plasma oxidizing treatment.

Then, as similar to the first example, the before described silicon film-forming step and the plasma oxidizing step were repeated about 300 times. Oxygen-terminated silicon nanocrystalline structure about 1 μm was formed on the silicon substrate 12.

Finally, the silicon substrate 12 was transferred to a substrate delivery chamber 140, to complete the treatment in the cluster unit system.

Example of Evaluation Test

To confirm the effect of the present invention, light-emitting elements using the silicon nanocrystalline structure (porous silicon) formed by the method of the present invention were compared in luminous efficiency with a silicon nanocrystalline structure in the prior art (anodizing treatment).

The light-emitting element for evaluation was prepared by forming an anti-reflection transparent electroconductive film such as ITO film as an upper electrode on a silicon substrate provided thereon with the oxygen-terminated silicon nanocrystalline structure in Example 1, a silicon substrate provided thereon with the nitrogen-terminated silicon nanocrystalline structure in Example 2, and a silicon substrate provided thereon with the oxygen-terminated silicon nanocrystalline structure in Example 3, each respectively, and then forming an ohmic electrode of an electroconductive material such as Au or Al on the backside of the silicon substrate.

As a comparative example, a light-emitting element was prepared by forming an anti-reflection transparent electroconductive film such as ITO film as an upper electrode on a silicon substrate provided thereon with a silicon nanocrystalline structure according to the conventional anodizing treatment, and then forming an ohmic electrode of an electroconductive material such as Au or Al on the backside of the silicon substrate.

Assuming that the luminous efficiency of the light-emitting element using a silicon nanocrystalline structure according to the conventional anodizing treatment was 100%, a luminous efficiency of about 300% was achieved by the light-emitting element using the silicon nanocrystalline structure in Example 1 and 2, and a luminous efficiency of about 400% by the light-emitting element using the silicon nanocrystalline structure in Example 3.

In the before described embodiments and the accompanying drawings of the present invention, the conditions described in the examples, etc., are those summarized to such a degree that the present invention can be understood. Accordingly, the present invention is not limited to the before described embodiments and the examples, and can be carried out under various conditions within the scope of the technical idea set forth in the claims.

What is claimed is:

1. A method of forming an oxygen- or nitrogen-terminated silicon nanocrystalline structure, which comprises a first step of forming a silicon film of 1 nm to 10 nm thickness composed of fine silicon crystals and amorphous silicon on a substrate and a second step of oxidizing or nitriding the formed silicon film with ions and radicals formed from an oxidizing gas or a nitriding gas to form the silicon nanocrystalline structure;

wherein said second step comprises substeps of disposing the substrate provided with the silicon film in an oxidizing gas atmosphere or nitriding gas atmosphere within a plasma treatment chamber and then plasma-oxidizing or plasma-nitriding the substrate provided with the silicon film by applying a high frequency electric field to the oxidizing gas atmosphere or nitriding gas atmosphere, the method further comprising, a third step of etching the surface of the silicon film on the substrate subjected to said second step with an HF-based gas or with a molecular gas system containing fluorine; and a fourth step of oxidizing or nitriding the silicon film on the substrate subjected to the etching in an oxidizing gas atmosphere or nitriding gas atmosphere.

2. A method for fabricating a silicon nanocrystalline structure, comprising:

a first step of forming a first silicon film of 1 nm to 10 nm thickness, which comprises fine silicon crystals and amorphous silicon, on a substrate;

a second step of plasma-oxidizing or plasma-nitriding the first silicon film;

a third step of forming a second silicon film of 1 nm to 10 nm thickness, which comprises fine silicon crystals and amorphous silicon, on the first silicon film subjected to the plasma-oxidizing or plasma-nitriding; and a fourth step of plasma-oxidizing or plasma-nitriding the second silicon film; and wherein the third and fourth steps are repeated until the thickness of a laminated structure of the plasma-oxidized or plasma-nitrided silicon films becomes a predetermined value.

3. A method according to claim 2, further comprising an etching step of etching the surface of the silicon film subjected to the plasma-oxidizing or plasma-nitriding between the step of plasma-oxidizing or plasma-nitriding the silicon film and the step of forming the next silicon film so that the next silicon film is formed on the surface of the silicon film subjected to the etching.

4. A method according to claim 3, further comprising a step of plasma-oxidizing or plasma-nitriding the silicon film between the step of etching the surface of the silicon film and the step of forming the next silicon film.

5. A method according to claim 2, wherein the silicon film forming step is carried out by using a thermal catalysis reaction in a gas system containing at least a silicon nitride gas and a hydrogen gas.

6. A method according to claim 2, wherein the silicon film forming step is carried out by setting the substrate at a predetermined temperature in a plasma treatment chamber and then applying a high-frequency electric field while regulating the inside of the plasma treatment chamber at a reduced pressure containing at least a silicon hydride gas and hydrogen gas.

7. A method which comprises fabricating a light emitting device which includes a silicon nanocrystalline structure, wherein the silicon nanocrystalline structure is formed by the method according to claim 3.

* * * * *